(12) United States Patent
Farago et al.

(10) Patent No.: US 7,454,680 B2
(45) Date of Patent: Nov. 18, 2008

(54) METHOD, SYSTEM AND COMPUTER PROGRAM PRODUCT FOR IMPROVING EFFICIENCY IN GENERATING HIGH-LEVEL COVERAGE DATA FOR A CIRCUIT-TESTING SCHEME

(75) Inventors: Steven Robert Farago, Austin, TX (US); Jason Raymond Baumgartner, Austin, TX (US); Claude Karl Detjens, Pflugerville, TX (US); Anita Devadason, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 634 days.

(21) Appl. No.: 10/903,301

(22) Filed: Jul. 30, 2004

(65) Prior Publication Data

US 2006/0025980 A1 Feb. 2, 2006

(51) Int. Cl.
*G01R 31/28* (2006.01)
*G06F 17/50* (2006.01)

(52) U.S. Cl. .......................... 714/739; 703/14

(58) Field of Classification Search ................. 714/739; 703/14
See application file for complete search history.

(56) References Cited

U.S. PATENT DOCUMENTS 6,021,261 A 2/2000 Barrett, Jr. et al.
6,212,667 B1 * 4/2001 Geer et al. ..................... 716/6

OTHER PUBLICATIONS

Raghavan et al., CoveT: A Coverage Tracker for Collision Events in System Verification, IEEE International Performance, Computing and Communications Conference, Feb. 1998, pp. 172-177.

* cited by examiner

Primary Examiner—Jacques Louis-Jacques
Assistant Examiner—John J Tabone, Jr.
(74) Attorney, Agent, or Firm—Casimer K. Salys; Dillon & Yudell LLP

(57) ABSTRACT

A method, system and computer program product for generating a coverage model to describe a testing scheme for a simulated system are described. In a preferred embodiment, a simulated system is tested with a testing simulation program. A simple event database is generated with the testing simulation program. Results of a checker analysis from the testing with the testing simulation program are obtained, and coverage data is created from a coverage model configuration file, the simple event database and the results of the checker analysis.

15 Claims, 4 Drawing Sheets

METHOD, SYSTEM AND COMPUTER PROGRAM PRODUCT FOR IMPROVING EFFICIENCY IN GENERATING HIGH-LEVEL COVERAGE DATA FOR A CIRCUIT-TESTING SCHEME

BACKGROUND OF THE INVENTION

1. Technical Field

The present invention relates in general to testing and verification and in particular to creating coverage models for testing schemes. Still more particularly, the present invention relates to a system, method and computer program product for improving efficiency in generating coverage data for a circuit testing scheme.

2. Description of the Related Art

With the increasing penetration of processor-based systems into every facet of human activity, demands have increased on the processor and application-specific integrated circuit (ASIC) development and production community to produce systems that are free from design flaws. Circuit products, including microprocessors, digital signal and other special-purpose processors, and ASICs, have become involved in the performance of a vast array of critical functions, and the involvement of microprocessors in the important tasks of daily life has heightened the expectation of error-free and flaw-free design. Whether the impact of errors in design would be measured in human lives or in mere dollars and cents, consumers of circuit products have lost tolerance for results polluted by design errors. Consumers will not tolerate, by way of example, miscalculations on the floor of the stock exchange, in the medical devices that support human life, or in the computers that control their automobiles. All of these activities represent areas where the need for reliable circuit results has risen to a mission-critical concern.

In response to the increasing need for reliable, error free designs, the processor and ASIC design and development community has developed rigorous, if incredibly expensive, methods for testing and verification. Simulation has been a traditional method for verifying such complex designs as processor chips. Since the simulation time for a design grows, in the worst case, as the cube of the number of logic elements, simulation and verification of complex systems is one of the most time-consuming computing tasks today. It is therefore important to use simulation cycles effectively, with the aim that few bugs escape and development time is reduced. One way to increase the simulation effectiveness is to use a simulation coverage tool that helps measure simulation effectiveness and refine the simulation process.

A coverage model defines the basic characteristics of events that constitute the coverage space. Conversely, a coverage space is a collection of all possible events or simulations that can legally occur in hardware. A coverage tool measures how much of a design has been exercised against a chosen coverage model. The operative word is exercised, because a coverage tool does not measure the correctness of a design. Several coverage models are possible for any given design.

Conventional methods for generating coverage data have serious drawbacks. Foremost among them, conventional coverage models depend on reading the input to a testing scheme (in the form of input traces) to determine what portions of the coverage space have been tested. While the input states are relevant, a model based on input states is not sufficiently descriptive of the internal state of hardware under test.

Second, conventional systems for generating coverage models are incredibly labor-intensive. Conventional systems for generating coverage models depend on the time-intensive creation, usually in a programming language, of detailed scripts for each desired coverage model of a given item of simulated hardware. Because system designs change rapidly and coverage models must likewise change rapidly, the investment of time necessary to develop coverage models has prohibited their most effective possible applications.

What is needed is a more efficient method for developing more accurate coverage models.

SUMMARY OF THE INVENTION

A method, system and computer program product for generating a coverage model to describe a testing scheme for a simulated system are disclosed. In a preferred embodiment, a simulated system is tested with a testing simulation program. A simple event database is generated with the testing simulation program. Results of a checker analysis from the testing with the testing simulation program are obtained, and coverage data is created from a coverage model configuration file, the simple event database and the results of the checker analysis.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed descriptions of an illustrative embodiment when read in conjunction with the accompanying drawings, wherein:

DETAILED DESCRIPTION OF THE PREFERRED EMBODIMENT

Figure 1:
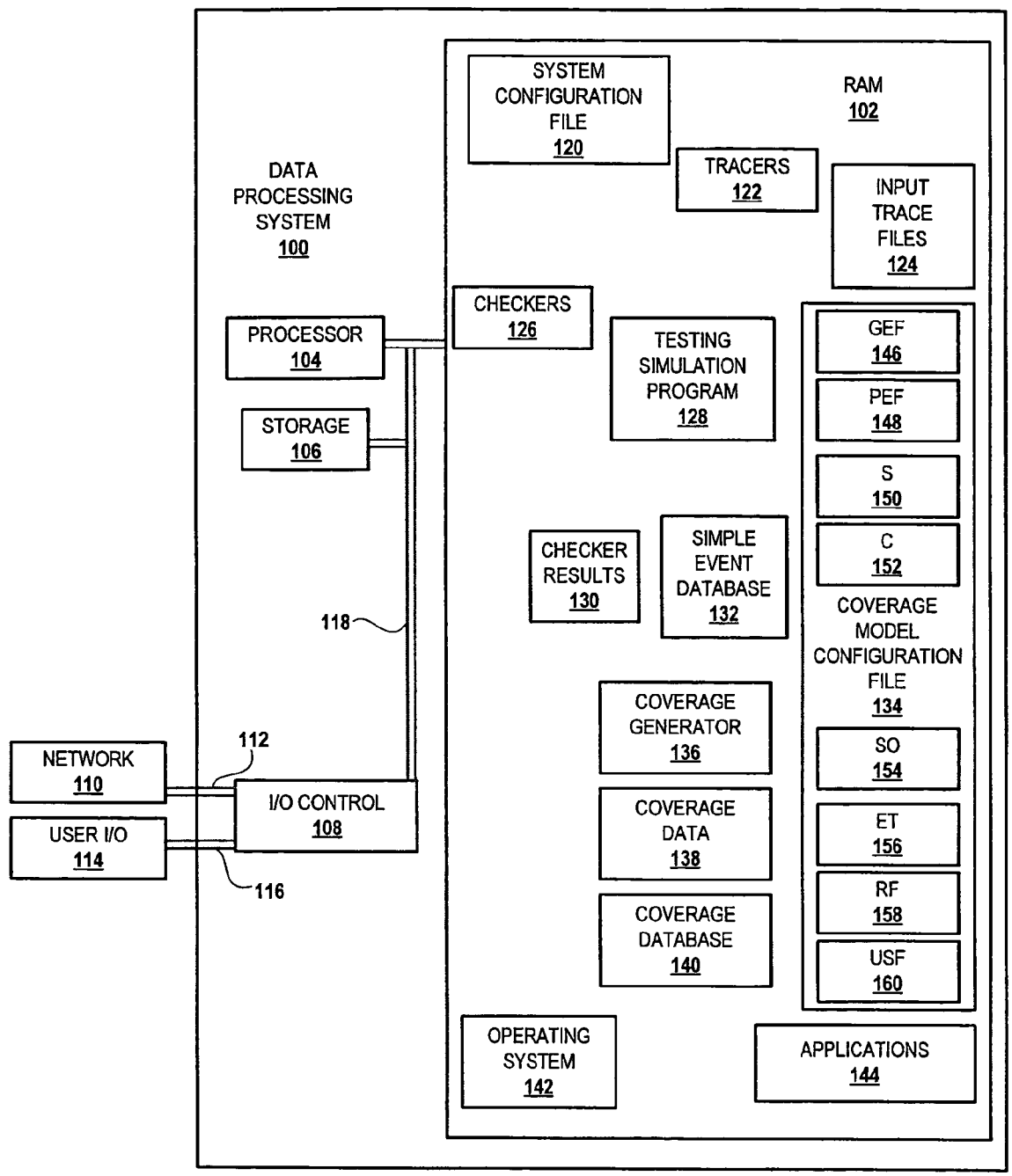
FIG. 1 is a block diagram of a data processing system equipped with a hardware simulation and testing system in accordance with a preferred embodiment of the present invention.

With reference now to figures and in particular with reference to FIG. 1, there is depicted a block diagram of a data processing system equipped with a hardware simulation and testing system, in accordance with a preferred embodiment of the present invention. Data processing system 100 contains a processing storage unit (e.g., RAM 102) and a processor 104. Data processing system 100 also includes non-volatile storage 106 such as a hard disk drive or other direct access storage device. An Input/Output (I/O) controller ("I/O CONTROL") 108 provides connectivity to a network 110 through a wired or wireless link, such as a network cable 112. I/O controller 108 connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention. These include: a system configuration file 120, tracers 122, input trace files 124, checkers 126, testing simulation program 128, checker results 130, simple event database 132, coverage model configuration file 134, coverage generator 136, coverage data 138, coverage database 140, operating system 142 and other applications 144. Tracers 122, testing simulation program 128, coverage generator 136, coverage database 140 and other applications 144 interface with processor 104, RAM 102, I/O control 108, and storage 106 through operating system 142. One skilled in the data processing arts will quickly realize that additional components of data processing system 200 may be added to or substituted for those shown without departing from the scope of the present invention.

Processor 104 executes instructions from programs, often stored in RAM 102, in the course of performing the present invention. In a preferred embodiment of the present invention, processor 104 executes tracers 122, testing simulation program 128, coverage generator 136, coverage database 140 and other applications 144, as well as operating system 142, though not all of tracers 122, testing simulation program 128, coverage generator 136, coverage database 140 and other applications 144, as well as operating system 142 will run simultaneously. Tracers 122 analyze system configuration file 120, which contains instructions for modeling specifications of a system topology and system properties of a simulated circuit or system, and generates input trace files 124, which contain instructions for simulating inputs to the simulated circuit described in system configuration file 120. The inputs to the simulated circuit or system described in system configuration file 120 are called input simple events.

Testing simulation program 128 includes a computer program product, stored in RAM 102 and executed on processor 104, which provides a series of tools for behavior-simulation testing. Generally speaking, testing simulation program 128 contains rule-based instructions for predicting the behavior of logically or mathematically modeled items of hardware and software, described in system configuration file 120, in response to simple events, described in input trace files 124. Testing simulation program 128 uses the series of rules contained in its own instructions, in conjunction with system configuration file 120, to predict the response of the simulated hardware modeled in system configuration file 120 to external and internal stimuli contained in input trace files 124.

Depending on what items of hardware are under test, system configuration file 120 may model the designs of many different kinds of hardware, but preferably provides a software representation of components such as microprocessors and application specific integrated circuits (ASICs). In the preferred embodiment depicted in FIG. 1, system configuration file 120 includes a simulated processor.

Testing simulation program 128 generates simple event database 132 containing output result trace files, called output simple events, which represent the response of the simulated hardware modeled in system configuration file 120 to external and internal stimuli contained in input trace files 124, and data for sorting the output result trace files by associated input simple events and time fields associated with the input simple events.

Testing simulation program 128 also runs checkers 126, which are instructions that verify particular events such as the interactions of the simulated hardware described by system configuration file 120 with external and internal stimuli contained in input trace files 124. The interactions of the simulated hardware described by system configuration file 120 with external and internal stimuli contained in input trace files 124 are verified by comparing output result trace files in simple event database 132 to expected values. Testing simulation program 128 then records results verified by checkers 126 to checker results 130, a result recording file. Testing simulation program 128 may also report the contents of checker results 130 or the status selected indicators of the status of system configuration file 120 to user I/O 114. Additionally, all or part of testing simulation program 128, operating system 142, input trace files 124, system configuration file 120, and checker results 130 may, at times, be stored in storage 106 or in RAM 102.

Coverage model configuration file 134 contains rules that specify how to form coverage events from output simple events contained in simple event database 132. A coverage event refers to a particular condition of the simulated hardware described by system configuration file 120. A goal of coverage analysis is to describe the coverage of relevant coverage events by the conditions described by the trace files in simple event database 132.

Coverage model configuration file 134 contains a coverage model specification, which indicates to coverage generator 136 the rules for forming complex coverage events from several simple events and specifies the format of the coverage events. In the preferred embodiment, a coverage model specification includes several attributes. An attribute called GLOBAL_EQUAL_FIELDS (GEF) 146 specifies simple event component attributes of a coverage event, which must have equal values. An attribute called PARTIAL_EQUAL_FIELDS 148 specifies selected component events, which must have equal values for listed fields. Time criteria are also specified in coverage model configuration file 134. Simple event components of a coverage event must meet the specified time criteria. An attribute called SEQUENTIAL (S) 150 specifies a list of simple events, which, when meeting the global criteria previously described, are monitored to determine if one follows the other in an ordered list (ordered by issue time) with no other simple events in between. An attribute called CONCURRENT (C) 152 specifies a list of simple events, which are monitored to determine if they are outstanding at the same time. A simple event is outstanding if it has issued (IT) and has not yet completed (CT) and performed (PT). An attribute called SEQUENTIAL_OVERLAP (SO) 154 specifies simple events, which are monitored to determine if they are both SEQUENTIAL and CONCURRENT as defined above.

Simple event restrictions allow the user to specify separate restrictions on each of the simple event components of a coverage event. It is possible to restrict the simple event component by event type (i.e., EVENT_TYPE field) (ET) 156, by association with a particular device in the system, which is defined in the system config file (i.e., RESTRICTED_FIELD) (RF) 158, or by results of analysis by a checker (i.e., USER_SELECTION_FIELD) (USF) 160. USF 160 allows coverage generator 136 to test arbitrary attributes associated by the checker with a simple event.

Further coverage event format specifications allow the user specify the format of the coverage event for the current model. For each component definition, the user can indicate which attribute of the simple event should be extracted and appended to the final coverage event string.

As used with respect to the preferred embodiment, a simple event is defined as all of the data associated with a single trace appearing in a simple event database 132. For example, all the times (IT, PT, CT), data, response, type, and source information for a single READ transaction on a bus would comprise a single simple event. By contrast, a coverage event is defined as an n-tuple of simple events. A single simple event that is a part of some valid coverage event is termed a component event of the coverage event. A coverage string is defined as a concatenation of the string values of various (possibly different) fields from each of the component events of a coverage event.

A coverage model is a specification that describes the number and type of simple events that can comprise a valid coverage event along with instructions detailing how to form a coverage string from a coverage event. Coverage models are defined in coverage model configuration file 134 and can be created or redefined by the users without the need to recompile any code.

A coverage model as described with respect to the preferred embodiment is one in which all simple event members of a coverage event either occur sequentially (e.g., there is no other valid Event with time between that of adjacent simple events) or concurrently (e.g., all simple events are outstanding at the same cycle) or both.

There are multiple types of attributes that need to be specified to define a coverage model. Component event attributes describe the attributes a simple event in isolation must have to be considered a part of a coverage event for a specific coverage model. An example would be to consider only those bus operations sourced by a device on the system bus as candidates for the first component of a coverage event.

Combinational attributes describe to coverage generator 136 the relationships component simple events (or a subset of simple events) must have in order to be considered a valid coverage event. For example, only events which reference the same cache line may comprise a valid coverage event. Additionally, coverage generator 136 must be instructed how to form a valid coverage string from a coverage event. That is, a coverage model must specify which data to extract from each simple event when forming a coverage string. For example, a coverage event can consist of 2 simple events, such as an instruction to form a coverage string by concatenating a sourcing device value of the first simple event, called DEVICE, and an operation type value of the second simple event, called OPERTYPE. Coverage event counts are based on counting the number of different coverage strings rather than counting coverage events.

Coverage generator 136 then employs checker results 130, simple event database 132, and coverage model configuration file 134 to generate coverage data 138, which coverage generator 136 supplies to coverage database 140 by executing rules contained in coverage model configuration file 134. Coverage data is generated by coverage generator 136 according to the rules of a coverage model. Coverage generator 136 can generate coverage data for one or more of a plurality of models, in response to a plurality of commands that may be present in coverage model configuration file 134.

Figure 2:
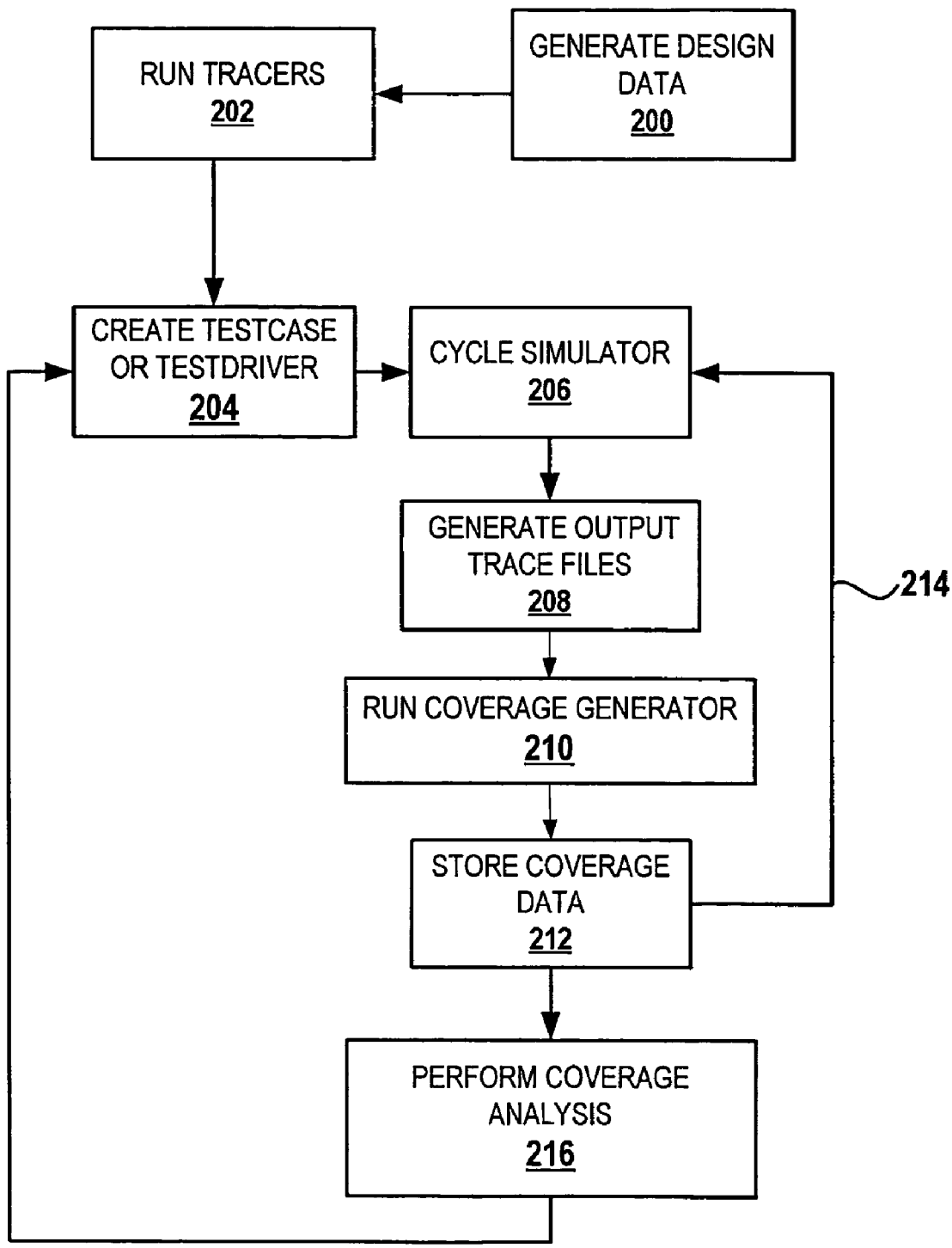
FIG. 2 depicts a data flow for a process for performing hardware simulation testing and generating coverage data, in accordance with a preferred embodiment of the present invention.

Turning now to FIG. 2, a data flow for a process for performing hardware simulation testing and generating coverage data, in accordance with a preferred embodiment of the present invention is depicted. The process begins with step 200, which depicts the creation of the design data such as system configuration file 120. The process then moves to step 202, which illustrates data processing system 100 running tracers 122. Tracers 122 use system configuration file 120 to create input trace files 124.

The process then proceeds to step 204, which depicts creation of a test case or test driver. In the initial case, test case or test drivers are based on system configuration file 120 and input trace files 124. The process next proceeds to step 206, which depicts data processing system 100 cycling a simulator, such as testing simulation program 128. Testing simulation program 128 employs checkers 126, input trace files 124 and system configuration file 120 to simulate the behavior of hardware specified in system configuration file 120 in response to stimuli represented in input trace files 124. Testing simulation program 128 is cycled, in that it is run repeatedly and iteratively.

The process next proceeds to step 208, which illustrates data processing system 100 creating output trace files, generated by testing simulation program 128, in the form of simple event database 132. The process then moves to step 210, which depicts operation on data processing system 100 of coverage generator 136. The operation of coverage generator 136 employs checker results 130, coverage model configuration file 134 and simple event database 132.

The process then proceeds to step 212, which depicts storage of the coverage data 138 generated by coverage generator 136. As indicated by return path 214, steps 206 through 212 can be repeated iteratively to collect coverage data 138 for multiple iterations of testing simulation program 128. Coverage data 138, collected over multiple simulation runs, is collectively referred to herein as coverage database 140.

Following step 212, he process then moves to step 216, which depicts performing a coverage analysis. Coverage analysis involves analyzing the coverage model contained in coverage database 140 to ascertain the strengths and limitations of checkers 126 and input trace files 124 in providing meaningful testing by testing simulation program 128. The process then moves to step 204, which illustrates forming a new test case or test driver in light of the results of coverage analysis in step 216. The process then repeats and continues until coverage analysis 216 indicates that effective coverage for the design has been achieved.

Figure 3:
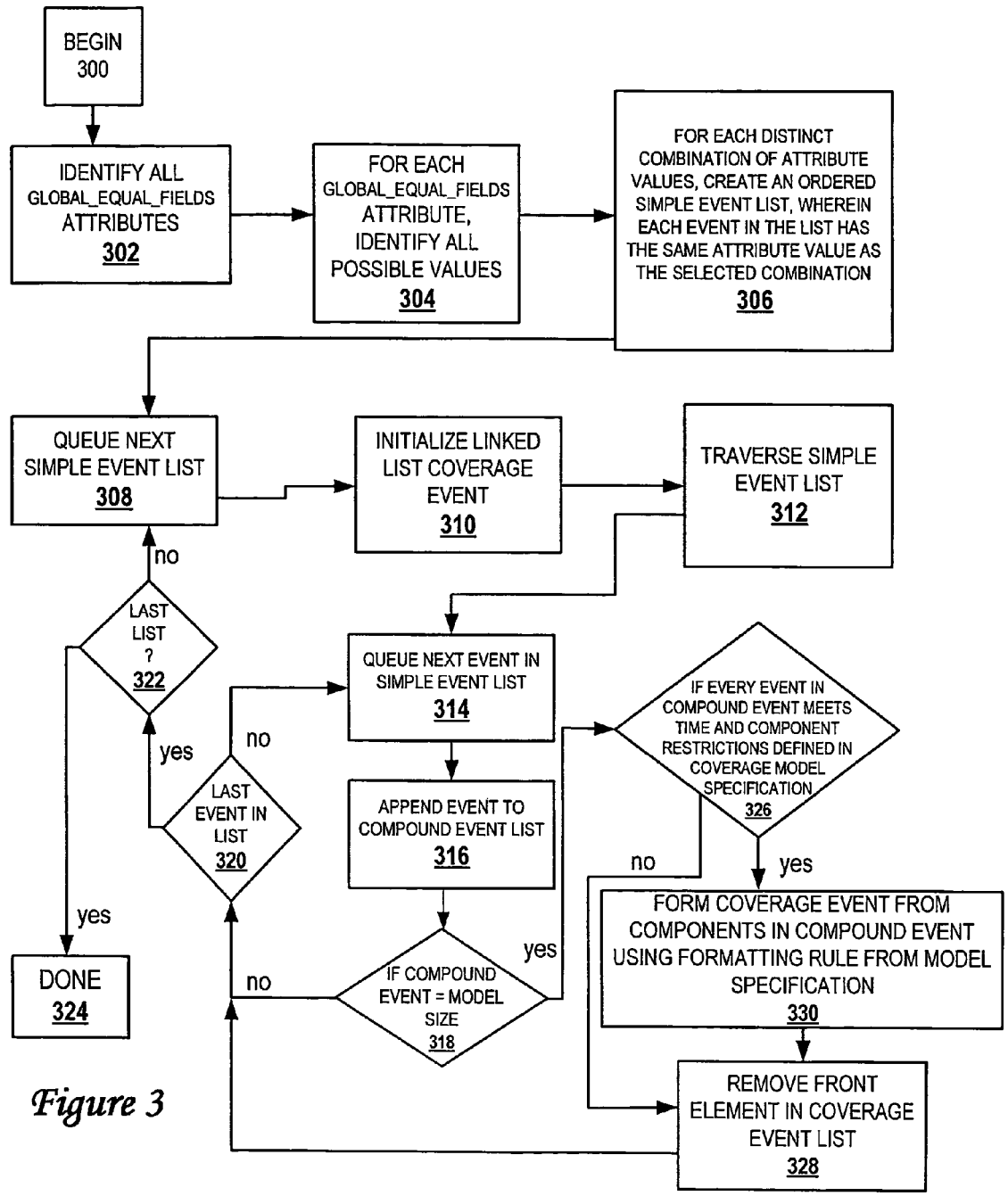
FIG. 3 is a high-level logical flowchart of an exemplary process for generating a sequential or sequential-concurrent coverage model in accordance with a preferred embodiment of the present invention.

With reference now to FIG. 3, a high level logical flowchart of a process for generating a sequential or sequential-concurrent coverage model in accordance with the preferred embodiment of the present invention is illustrated. The process begins at step 300, which corresponds to activation of coverage generator 136. The process next moves to step 302, which depicts coverage generator 136 identifying all GEF 146 attributes listed in coverage model configuration file 134. The process then proceeds to step 304, which depicts coverage generator 136 identifying all possible values for each attribute identified in step 302. The process next moves to step 306, which illustrates the coverage generator 136 creating an ordered simple event list, where for each distinct combination of attribute values identified in step 304, each event in the list has the same attribute value as the selected combination.

The process then moves to step 308, which depicts coverage generator 136 queuing a next simple event list. The process next proceeds to step 310, which illustrates coverage generator 136 initializing a linked list of coverage events. The process then moves to step 312, which depicts coverage generator 136 traversing the simple event list queued in step 308. The process next proceeds to step 314, which depicts coverage generator 136 queuing the next event in the simple event list designated in step 308. The process then moves to step 316, which depicts coverage generator 136 appending an event to a compound event list.

Next at step 318, coverage generator 136 determines whether the compound event size equals the current model size, which model size is the number of simple events in a coverage event for the model under construction. If the compound event size does not equal the current model size, then the process next moves to step 320, which depicts coverage generator 136 determining whether the current queued event, (queued in step 314) is the last event in the applicable simple event list. If the current simple event is not the last event in the current simple event list, then the process proceeds to step 314, which depicts coverage generator 136 queuing the next event in the simple event list.

If in step 320, coverage generator 136 determines that the event queued in step 314 is the last event in the simple event list, the process moves to step 322. Step 322 depicts coverage generator 136 determining whether the current list is the last simple event list. If in step 322, coverage generator 136 determines that the current list is not the last simple event list, then the process returns to step 308, which depicts coverage generator 136 queuing the next simple event list for processing. If in step 322, coverage generator 136 determines that the current list is the last list, then the process ends at step 324.

If in step 318, coverage generator 136 determines that the compound event size equals the model size, then the process moves to step 326, which depicts coverage generator 136 determining if every event in the compound event meets the time and component restrictions defined in the coverage model configuration file 134. If every event in the compound event does not meet the time and component restrictions defined in the coverage model configuration file 134, then the process moves to step 328 which depicts coverage generator 136 removing the front element in the current coverage event list.

The process then moves to step 320, which is described above. If in step 326, the current event meets all time and component restrictions defined in coverage model specification, then the process moves to step 330, which depicts coverage generator 136 forming a coverage event from components in the compound event using formatting rules from coverage model configuration file 134. The process then proceeds to step 330, which is described above.

Figure 4:
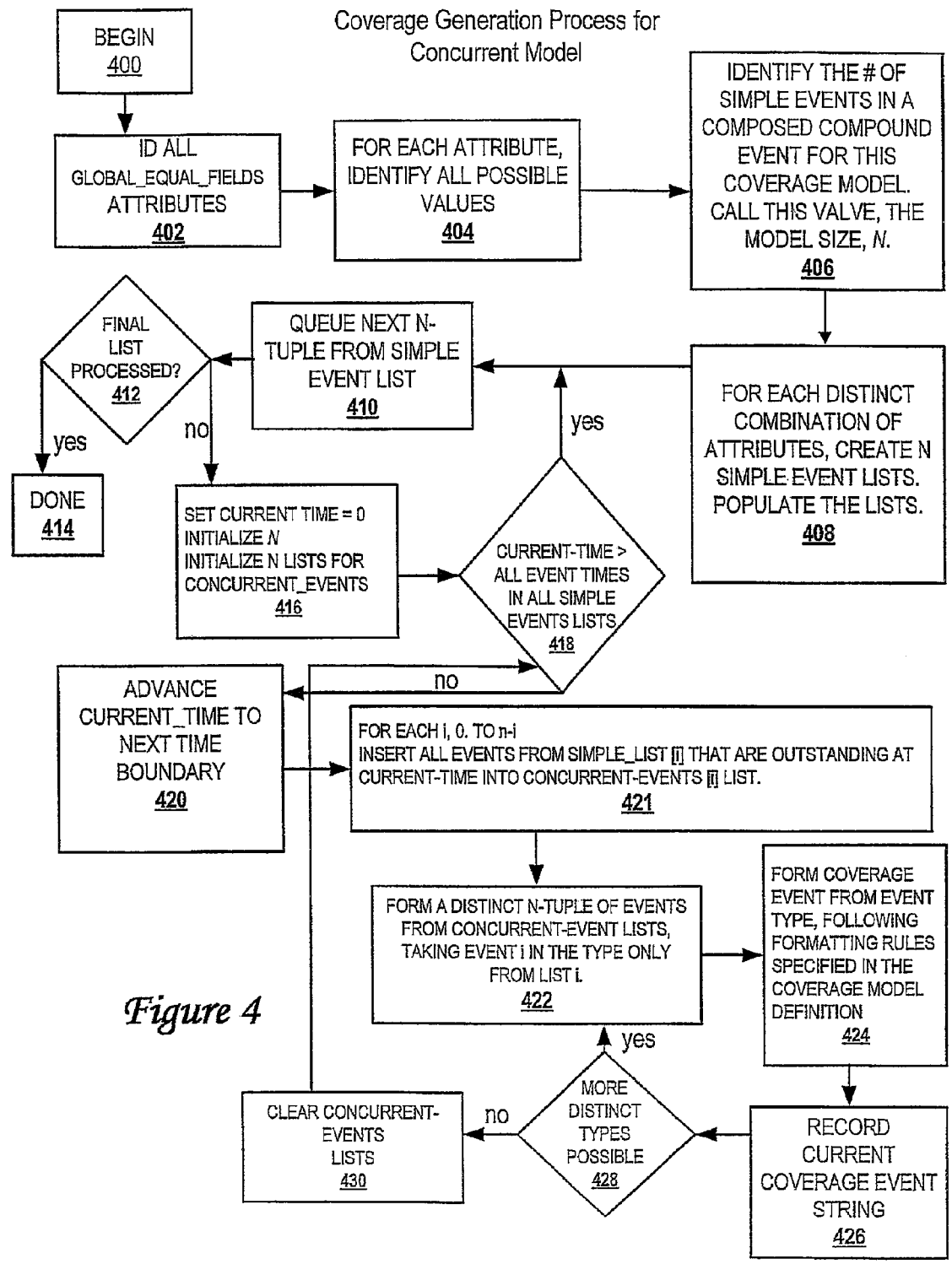
FIG. 4 is a high-level logical flowchart of an exemplary process for generating a concurrent coverage model in accordance with a preferred embodiment of the present invention.

Turning now to FIG. 4, a high-level logical flowchart of an exemplary process for generating a concurrent coverage model in accordance with the preferred embodiment of the present invention is depicted.

The process begins at step 400, which corresponds to activation of coverage generator 136. The process next moves to step 402, which depicts coverage generator 136 identifying all GEF 146 attributes listed in coverage model configuration file 134. The process then proceeds to step 404, which depicts coverage generator 136 identifying all possible values for each attribute identified in step 402.

The process then moves to step 406, which illustrates coverage generator 136 identifying the number of simple events that compose a compound event for the current coverage model, a value hereafter referred to as n. The process then moves to step 408, which depicts for each distinct combination of attributes, coverage generator 136 creating simple event lists. Coverage generator 136 populates each list with events that have the same attribute settings as the current combination and, for each list, inserts only events that are not restricted by the appropriate component list event definition of the coverage model.

The process then moves to step 410, which depicts queuing the next n-tuple of the simple event list. The process then moves to step 412, which illustrates coverage generator 136 determining whether the final simple event list has been processed. If, in step 412, coverage generator 136 determines that the final list has been processed, then the process proceeds to step 414, which depicts the end of the process. If, in step 412, coverage generator 136 determines that the final list has not been processed, then the process moves to step 416, which depicts coverage generator 136 setting the current time to zero, initializing the model size n, selecting the current set of lists of selected concurrent events based on concurrent attribute settings.

The process next proceeds to step 418, which illustrates coverage generator 136 determining whether the current time is greater than all event times in all simple lists. If the current time is greater than all event times in all simple lists, then the process moves to step 410, which depicts queuing the next n-tuple of simple lists, as described above. If the current time is not greater than all event times and all simple lists, the process moves to step 420, which depicts advancing the current time to the next time boundary. The next time boundary is defined as the first event in which one of the pair of parameters IT, PT is greater than the current time over all lists in simple event list n-tuple. The process then proceeds to step 421, which illustrates, for each i, which is an index over all component lists, zero to n-i, coverage generator 136 inserting all events from the ith simple list that are outstanding at current time into an ith concurrent events list. The process then moves to step 422, which depicts coverage generator 136 forming a distinct n-tuple list of events from the ith concurrent events list by taking event i in the n-tuple from the ith list.

The process next proceeds to step 424, which depicts coverage generator 136 forming a coverage event from an event tuple, following formatting rules specified in the coverage model definition. The process then proceeds to step 426, which depicts coverage generator 136 recording the current coverage event string. The process next proceeds to step 428, which illustrates coverage generator 136 determining whether more distinct coverage tuples are possible. If more distinct coverage tuples are possible, the process then moves to step 420, which is described above. If no more distinct tuples are possible, the process then proceeds to step 430, which depicts coverage model 136, querying the concurrent events list. The process next moves to step 418.

The present invention provides several advantages over prior art solutions for creating coverage models. First, much of the software infrastructure required to create coverage data, which prior art methods required to be generated through time-intensive creation, usually in a programming language, of detailed scripts for each desired coverage model of a given item of simulated hardware, is supplied as a part of the present invention. The reduction of dependence on scripts through a fully integrated coverage modeling tool reduces development and maintenance cost. Second, the computational resources required for both coverage and checking are reduced because files and data structures are shared, rather than needing to be recreated for the separate activities. Additionally, checker data can be used for forming the coverage data, increasing accuracy of the coverage model and increasing flexibility of the coverage model by allowing more types to be created. Finally, with shared input files, the checking and coverage performance work from the same trace data, which results in coverage models that more closely approximate actual coverage performance.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of computer-readable storage media. Examples of computer-readable storage media include recordable type media such as floppy disks or CD ROMs.

What is claimed is:

1. A method of generating a coverage model to describe a testing scheme for a simulated system, said method comprising:
   testing a simulated system with a testing simulation program;
   generating a simple event database with said testing simulation program, said simple event database containing output result trace files and data for sorting said output result trace files by associated input simple events and time fields associated with said input simple events;
   obtaining results of a checker analysis from said testing with said testing simulation program; and
   creating coverage data, said coverage data including coverage events, wherein a coverage event comprises an n-tuple of simple events, from said simple event database, said results of said checker analysis, and a coverage model configuration file, said coverage model configuration file including a coverage model specification that specifies rules for forming and formatting coverage events from simple events contained in said simple event database, wherein creating said coverage data includes;
   identifying attributes in said coverage model configuration file;
   identifying possible values for each attribute;
   creating a simple event list for each distinct combination of attribute values;
   populating said simple event lists with simple events; and,
   forming coverage events from said simple event lists.

2. The method of claim 1, wherein said step of testing a simulated system with a testing simulation program further comprises testing a simulated system with a testing simulation program that employs a system configuration file describing said simulated system with a specification of system topology and system properties.

3. The method of claim 1, wherein said step of testing a simulated system with a testing simulation program further comprises testing a simulated system with a testing simulation program that employs checkers that verify particular events.

4. The method of claim 1, wherein said step of creating coverage data further comprises creating a particular type of coverage model in response to a single command in said coverage model configuration file.

5. The method of claim 1, wherein said step of creating coverage data further comprises creating a plurality of distinct types of coverage models in response to a plurality of commands in said coverage model configuration file.

6. A system for generating a coverage model to describe a testing scheme for a simulated system, said method comprising:
   means for testing a simulated system with a testing simulation program;
   means for generating a simple event database with said testing simulation program, said simple event database containing output result trace files and data for sorting said output result trace files by associated input simple events and time fields associated with said input simple events;
   means for obtaining results of a checker analysis from said testing with said testing simulation program; and
   means for creating coverage data, said coverage data including coverage events, wherein a coverage event comprises an n-tuple of simple events, from said simple event database, said results of said checker analysis, and a coverage model configuration file, said coverage model configuration file including a coverage model specification that specifies rules for forming and formatting coverage events from simple events contained in said simple event database, wherein said means for creating said coverage data includes;
   means for dentifying attributes in said coverage model configuration file;
   means for identifying possible values for said attributes;
   means for creating a simple event list for each distinct combination of attribute values;
   means for populating said simple event lists with simple events from said simple event database; and,
   means for forming coverage events from said simple event lists.

7. The system of claim 6, wherein said means for testing a simulated system with a testing simulation program further comprises means for testing a simulated system with a testing simulation program that employs a system configuration file describing said simulated system with a specification of system topology and system properties.

8. The system of claim 6, wherein said means for testing a simulated system with a testing simulation program further comprises means for testing a simulated system with a testing simulation program that employs checkers that verify particular events.

9. The system of claim 6, wherein said means for creating coverage data further comprises means for creating a particular type of coverage model in response to a single command in said coverage model configuration file.

10. The system of claim 6, wherein said means for creating coverage data further comprises means for creating a plurality of distinct types of coverage models in response to a plurality of commands in said coverage model configuration file.

11. A computer program product in a computer-readable storage medium for generating a coverage model to describe a testing scheme for a simulated system, said computer program product comprising:
   a computer-readable storage medium;
   instructions on said computer-readable medium for testing a simulated system with a testing simulation program;
   instructions on said computer-readable storage medium for generating a simple event database with said testing simulation program, said simple event database containing output result trace files and data for sorting said output result trace files by associated input simple events and time fields associated with said input simple events;
   instructions on said computer-readable storage medium for obtaining results of a checker analysis from said testing with said testing simulation program; and
   instructions on said computer-readable storage medium for creating coverage data, said coverage data including coverage events, wherein a coverage event comprises an n-tuple of simple events, from said simple event database, said results of said checker analysis, and a coverage model configuration file, said coverage model configuration file including a coverage model specification that specifies rules for forming and formatting coverage events from simple events contained in said simple event database, wherein said instructions on said computer-readable storage medium for creating said coverage data includes;
   instructions on said computer-readable storage medium for dentifying attributes in said coverage model configuration file;

instructions on said computer-readable storage medium for identifying possible values for each attribute;

instructions on said computer-readable storage medium for creating a simple event list for each distinct combination of attribute values;

instructions on said computer-readable storage medium for populating said simple event lists with simple events; and, instructions on said computer-readable storage medium for forming coverage events from said simple event lists.

12. The computer program product of claim 11, wherein said instructions for testing a simulated system with a testing simulation program further comprise instructions on the computer-readable storage medium for testing a simulated system with a testing simulation program that employs a system configuration file describing said simulated system with a specification of system topology and system properties.

13. The computer program product of claim 11, wherein said instructions for testing a simulated system with a testing simulation program further comprise instructions on the computer-readable storage medium for testing a simulated system with a testing simulation program that employs checkers that verify particular events.

14. The computer program product of claim 11, wherein said instructions for creating coverage data further comprise instructions on the computer-readable storage medium for creating a particular type of coverage model in response to a single command in said coverage model configuration file.

15. The computer program product of claim 11, wherein said instructions for creating coverage data further comprise instructions on the computer-readable storage medium for creating a plurality of distinct types of coverage models in response to a plurality of commands in said coverage model configuration file.

* * * * *